(12) United States Patent
Fan et al.

(10) Patent No.: US 8,063,699 B2
(45) Date of Patent: Nov. 22, 2011

(54) ANTI-POP CIRCUIT

(75) Inventors: Xin Fan, Irvine, CA (US); Christian Larsen, Irvine, CA (US); Lorenzo Crespi, Costa Mesa, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 76 days.

(21) Appl. No.: 12/488,438

(22) Filed: Jun. 19, 2009

(65) Prior Publication Data

US 2010/0321112 A1    Dec. 23, 2010

(51) Int. Cl.
*H03F 1/14* (2006.01)
(52) U.S. Cl. .......................................... 330/51; 330/298
(58) Field of Classification Search .................. 330/51, 330/251, 253, 255, 294; 381/94.5
See application file for complete search history.

(56) References Cited

U.S. PATENT DOCUMENTS

| | | | |
|---|---|---|---|
| 4,788,508 A | 11/1988 | Kawai | |
| 6,040,740 A | 3/2000 | Dondale | |
| 6,122,749 A | 9/2000 | Gulick | |
| 6,216,052 B1 | 4/2001 | Gulick | |
| 6,316,993 B1 | 11/2001 | Hellums | |
| 6,492,928 B1 | 12/2002 | Rhode et al. | |
| 6,600,365 B1 | 7/2003 | Frith | |
| 7,079,450 B2 | 7/2006 | Breed et al. | |
| 7,164,312 B1 | 1/2007 | Singh et al. | |
| 7,573,333 B2 * | 8/2009 | Yokota | 330/255 |
| 7,652,534 B1 * | 1/2010 | Lin et al. | 330/255 |
| 2007/0019828 A1 | 1/2007 | Hughes | |
| 2008/0018395 A1 | 1/2008 | Chi et al. | |

OTHER PUBLICATIONS

Palmisano, G.; Palumbo, G., "An Optimized Compensation Strategy for Two-Stage CMOS OP AMPS", IEEE Transactions, Circuits and Systems I: Fundamental Theory and Applications, Mar. 1995, pp. 178-182, vol. 42, Issue 3.

\* cited by examiner

*Primary Examiner* — Robert Pascal
*Assistant Examiner* — Khiem Nguyen
(74) *Attorney, Agent, or Firm* — Jackson Walker L.L.P.; Christopher J. Rourk

(57) ABSTRACT

Presently many audio chips suffer from pop issues, which is especially serious for single ended audio drivers. An audio pop is a disturbance in the output caused by a sudden transition of chip power, particularly when a chip is powered on or powered off. Furthermore, compensation networks included in the amplifiers on audio chips for stability offer a significant path for transmitting power disturbances to the output. Hence, circuitry is developed to suppress pops in the output stages of an amplifier.

22 Claims, 16 Drawing Sheets

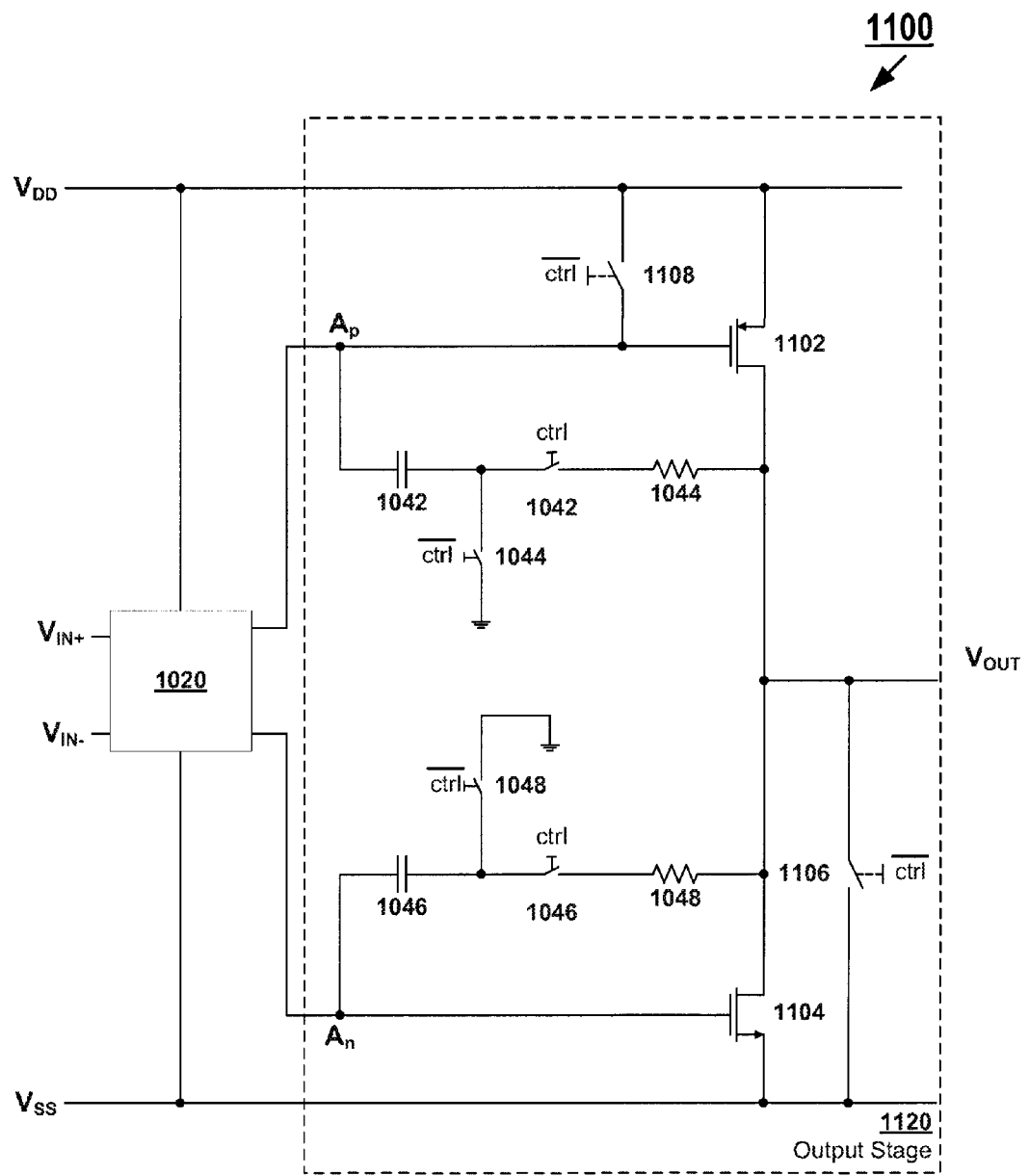
FIG. 11
(AMENDED)

ANTI-POP CIRCUIT

BACKGROUND OF THE INVENTION

1. Field of the Invention

The present invention relates generally to audio amplifiers and drivers and specifically with the mitigation of audio pops.

2. Related Art

A significant issue with audio drivers in present technology arises from audio "pops." Term "pop" in the audio field is an output disturbance caused by a sudden transition of a chip's power. In particular, the problem is especially pronounced when power is initially turned on (or equivalently off). Pops during when a chip powers up because the various components receive power and may cause voltage to be seen at the output even though there is no signal. Similarly, a pop can occur when the power is switched off because energy may be stored in the circuitry and the power may inadvertently be dissipated through the output even though no input signal is received. Furthermore, because of capacitive and inductive effects, the voltage can even spike when the power to a chip is switched on or off.

The pop issue manifests itself frequently in the driver or power portion of an audio circuit. This is commonly implemented with some form of amplifier. Two stage amplifiers are commonly used in audio applications. In particular the first stage is referred to as the amplifier stage and the second stage referred to as the output stage. Generally speaking, the amplifier stage supplies the gain and the output stage provides high current driving capability, low impedance. In the case of amplifier with differential inputs, the amplifier stage can supply either a single output representative of the difference between the input signals or can provide a differential output.

FIG. 1A illustrates a conventional design for a two stage amplifier. In this example, the circuit is operational amplifier 100 with amplifier stage 110 and output stage 160. Amplifier stage 110 comprises field effect transistors (FETs) 112, 114, 116, 118, and 120. A differential input $V_{IN+}$ and $V_{IN-}$ are received by FET 116 and FET 118. An output based on the difference between $V_{IN+}$ and $V_{IN-}$ is supplied to the output stage at node A. Output stage 160 comprises FET 162 which receives the output at node A and FET 164. The output stage produces an amplified output signal $V_{OUT}$ which is based on the difference between $V_{IN+}$ and $V_{IN-}$. The primary purpose of the output stage is not to provide gain but to maintain the output regardless of the current drawn through it. However, in some implementations the output stage may supply some amount of gain.

One of ordinary skill in the art would recognize there are countless designs for the amplifier stage and output stage. The design shown in FIG. 1A is a representative design. In order to simplify the remaining disclosure, where appropriate, the amplifier stage and/or output stage are represented by a symbol.

FIG. 1B illustrates a design for a general design for a two-stage amplifier. Amplifier 100 comprises amplifier stage 110 which derives a signal from $V_{IN+}$ and $V_{IN-}$ and provides an output a node A. It also comprises output stage 160 which takes the output signal at node A and maintains output signal $V_{OUT}$ regardless of the current drawn by the attached load.

The difficulty with two-stage amplifiers is that generally they are inherently unstable. In order to address this issue, many compensation circuits exist. One of the most basic is to add an resistor and capacitor in feedback from the output to the input of the output stage.

FIG. 2 illustrates a two-stage amplifier with a basic compensation network. In amplifier 200, capacitor 202 and resistor 204 are added to output stage 220 in feedback from the output to input at node A. The original circuitry described as output stage 160 in amplifier 100 are now referred to as the core output stage to avoid confusion. This feedback from the output to node A provides stability to the two-stage amplifier. However, it provides another source of pop. For example, when amplifier stage 110 is powered up the voltage at node A may be spike. Through capacitor 202 and resistor 204, that spike can be transmitted to the output causing the pop.

Previous solutions have been applied to audio systems having additional circuitry. Specifically, FIG. 3 illustrates an audio system which comprises in addition to amplifier 200, a sound output apparatus comprising low pass filter 302 and output circuit 304 is inserted between $V_{OUT}$ and the load such as a speaker. In many applications low pass filters are used prior to attaching an audio system to a load. In addition output circuit 304 comprises an electrostatic protection circuit which is used to shunt harmful external static electricity away from the remainder of the audio system.

In such an implementation, previous solutions have added anti-pop circuit 310 into the sound output apparatus. Anti-pop circuit 310 comprises shunting capacitor 314 and switch 312. Control circuit 316 closes switch 312 before power is switched on and switched off. When switch 312 is closed, the output of low pass filter 302 is shunted to ground through shunting capacitor 314, thus draining any voltage spikes to ground before they can manifest themselves as a peak.

The primary drawback to this type of solution is that it requires a sound output apparatus to be placed external to the amplifier. In modern audio systems, there is a desired to eliminate the sound output apparatus. In particular, because the low pass filter is placed near the output, the low pass filter must be designed to accommodate high power. As a result, the low pass filter is bulky, expensive and consumes a lot of power. The elimination of the low pass filter and/or output circuit can reduce power consumption and expense, but it also eliminates the opportunity to deploy an anti-pop circuit such as anti-pop circuit 310.

Thus there is a need in the industry for an inexpensive, compact solution that reduces or eliminates the audio pop in an audio amplifier without the need for expensive additional circuitry.

SUMMARY OF INVENTION

A circuit and method for use in a reduced pop amplifier is disclosed comprising an amplifier stage and an output stage. The output stage comprises a core output stage and a compensation network coupled to the input and output of the core output stage to provide amplifier stability. The compensation network comprises a capacitor and two switches with the first switch breaking the connectivity between the input and output of the core amplifier stage and a second switch which shunts the capacitor to ground when the control signal is low. Typically, the compensation network also comprises a resistor. Optionally, the output stage comprises a third switch which pulls the output of the core amplifier stage to ground.

In a specific implementation, the core output stage is a push-pull output stage receiving two bias signals which can be a class AB control signal. Two compensation networks are used to feedback the output of the push-pull output stage to each of the two bias inputs. In addition to switches to break the connectivity between each bias input and the output and the switch to pull the output to ground.

The control signal used to control the switches is low when the amplifier is powered down and remains low until after the amplifier is powered up and remains high until before the amplifier is powered down.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 11 illustrates an example of an amplifier with push-pull output stage;

DETAILED DESCRIPTION

Figure 1A:
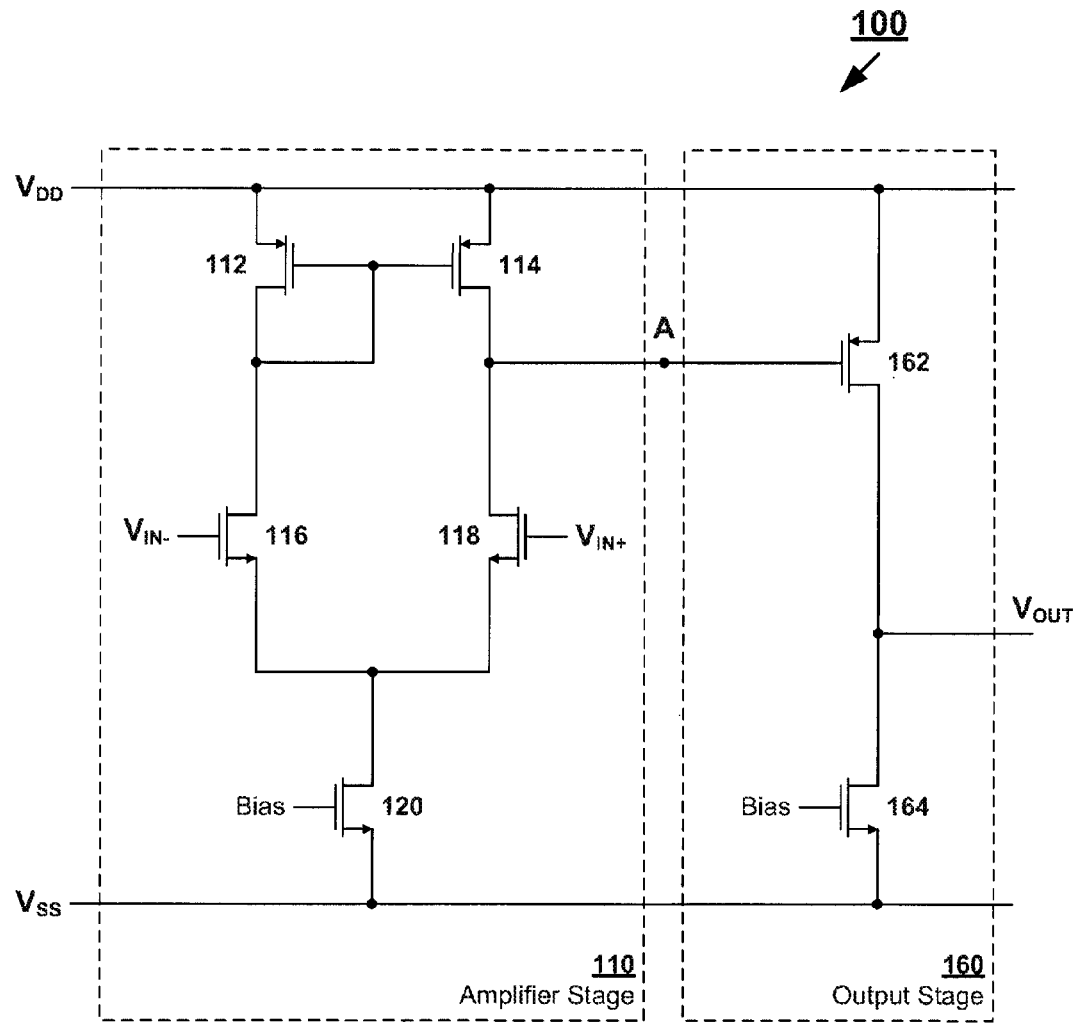
FIG. 1A illustrates a conventional design for a two stage amplifier.
Figure 1B:
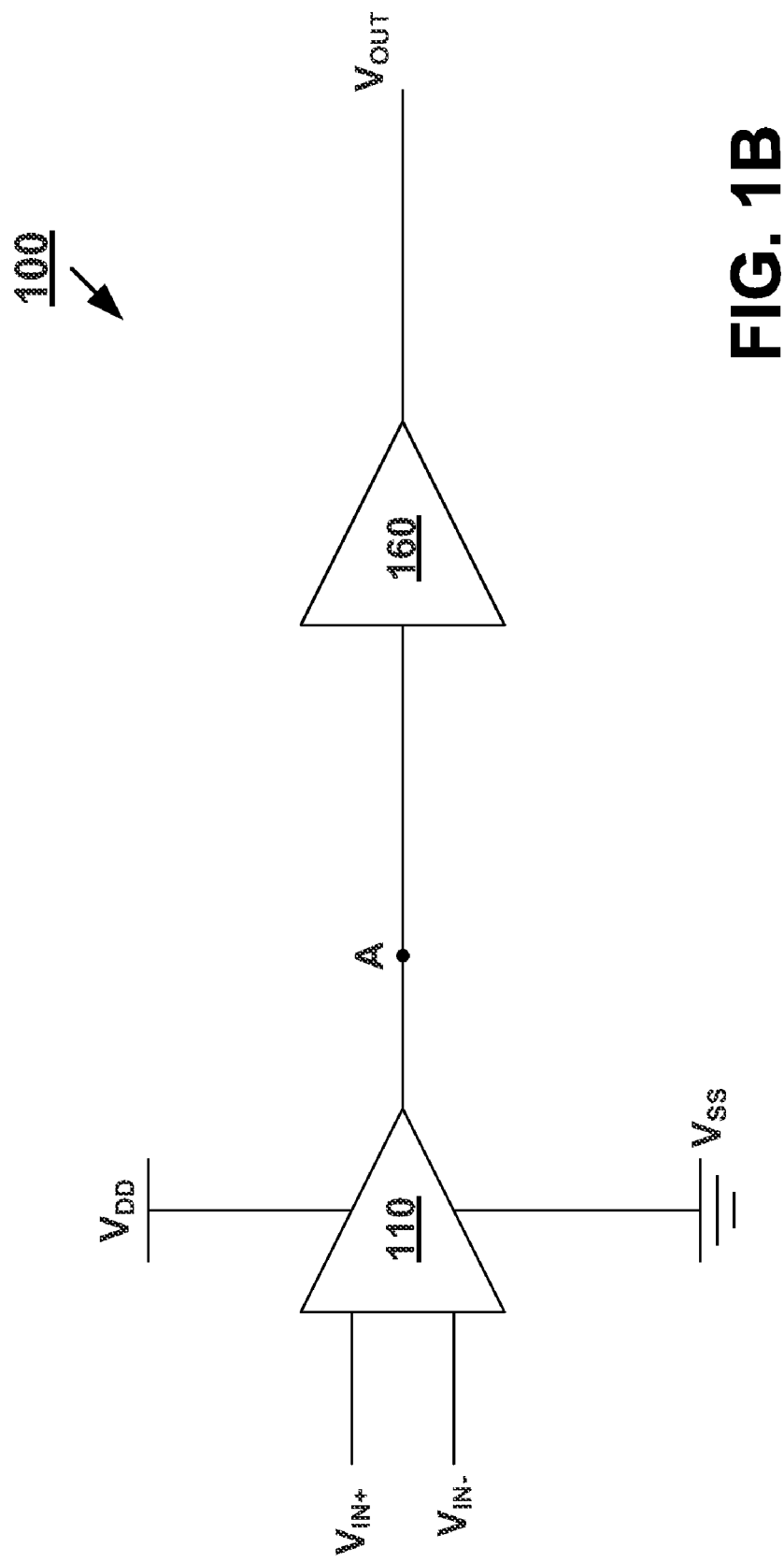
FIG. 1B illustrates a design for a general design for a two-stage amplifier.
Figure 2:
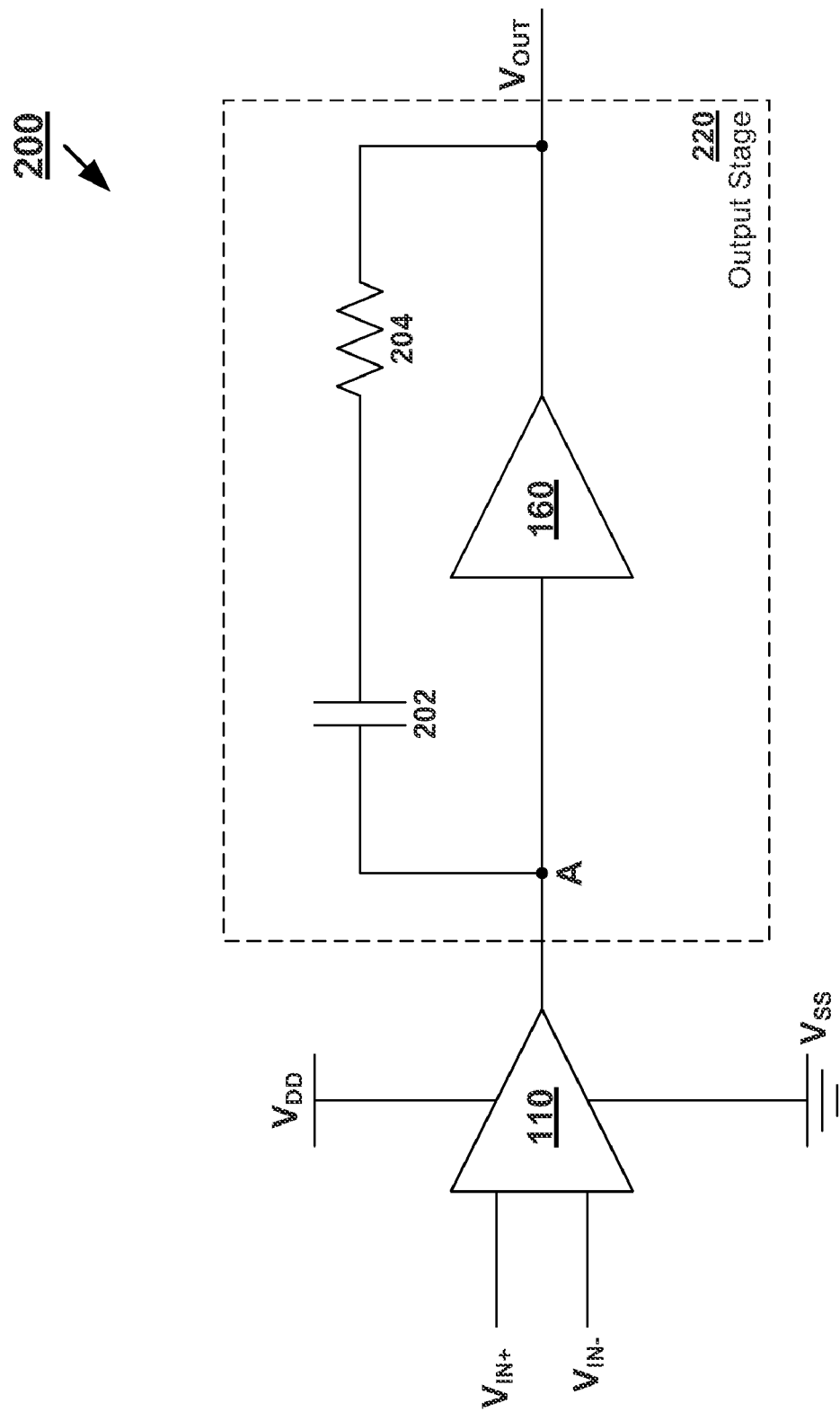
FIG. 2 illustrates a two-stage amplifier with a basic compensation network.
Figure 3:
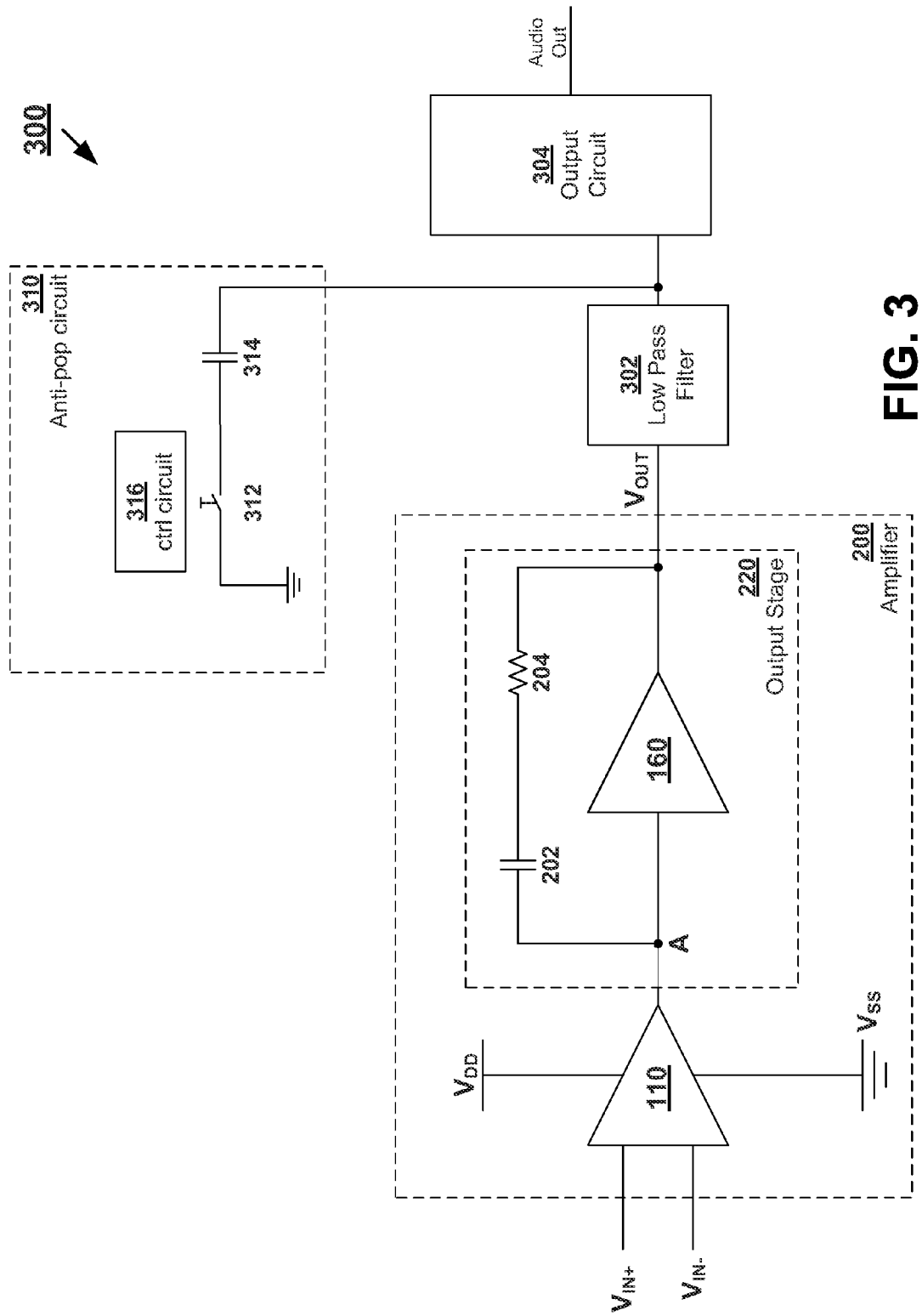
FIG. 3 illustrates an audio system which comprises in addition to an amplifier, a sound output apparatus.
Figure 4:
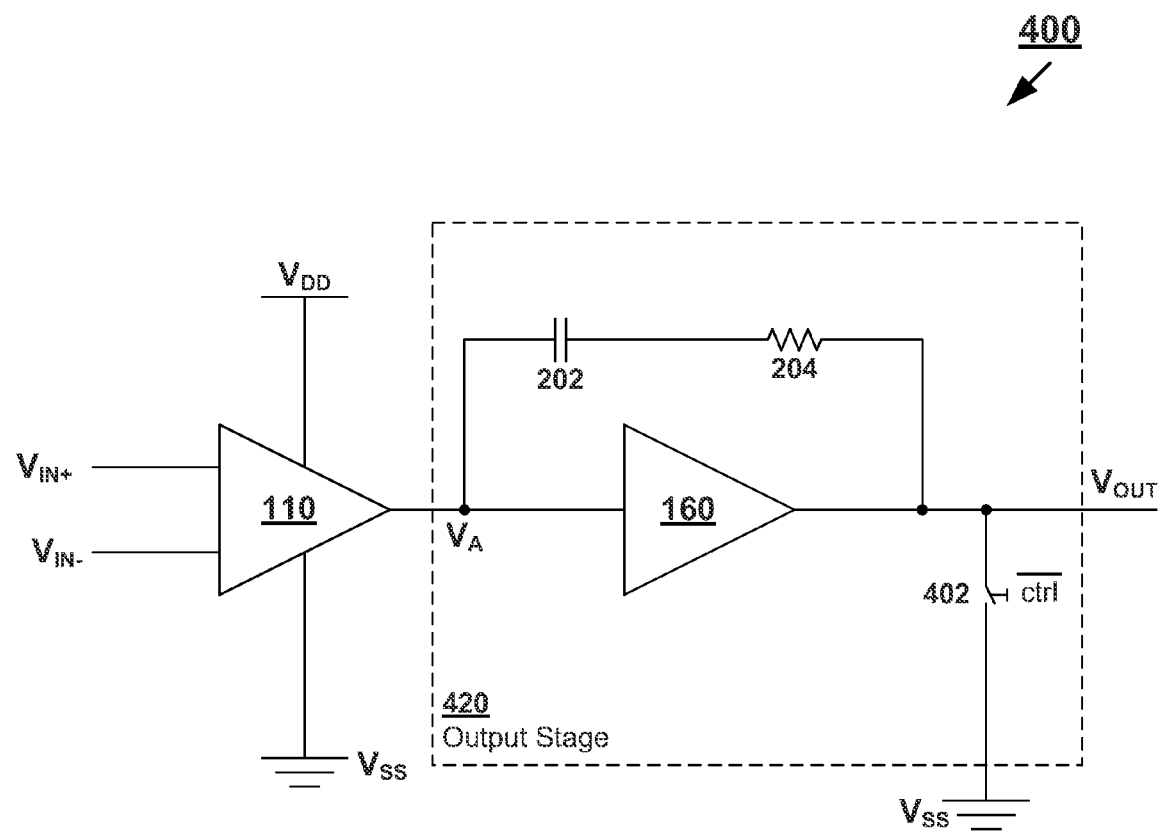
FIG. 4 illustrates an amplifier equipped with an anti-pop circuit which can be implemented with simple switches.

FIG. 4 illustrates an amplifier equipped with an anti-pop circuit which can be implemented with simple switches. Amplifier 400 is similar to amplifier 200. Amplifier 400 comprises amplifier stage 110 and output stage 420. Like output stage 220 of amplifier 200, output stage 420 comprises core output stage 160 and a compensation network comprising capacitor 202 and resistor 204. The described components function essentially the same as that described for amplifier 200. However, output stage 420 further comprises switch 402. When closed switch 402, it drags the output voltage $V_{OUT}$ to $V_{SS}$ which is shown as ground in FIG. 4. It should be noted that often $V_{SS}$ is fixed to ground. However, for the purposes of this disclosure ground and $V_{SS}$ are used interchangeably and should be construed to be the low power rail and not necessarily a zero voltage.

Switch 402 is controlled by a control signal. Therefore the switch initially is closed when the control signal is low but the switch is opened when the control signal is high. The control signal should be activated prior to power supply $V_{DD}$ ramping up to avoid an output pop. As $V_{DD}$ increases switch 402 is eventually closed, but during the initial ramp up period, switch 402 may remain open thus permitting some pop to be manifested at the output. In order to maintain generality, $V_{DD}$ is often referred to as the high power voltage or high power rail and $V_{SS}$ is often referred to as the low power voltage, low power rail or ground. It should be noted that notationally, the switches described in each of these diagrams is controlled by an individual input (not to be confused with a control signal given to the amplifier (ctrl) as described above). For the sake of notation, these switches are open when the input is low and closed when the input is high. For that reason switch 402 is shown to be controlled by the logical complement of ctrl that is $\overline{ctrl}$.

However, only switch 402 is not enough for the pop control because, even though output $V_{OUT}$, is grounded during the power up (or power down) periods, the voltage built up at node A can still tend to drive the $V_{OUT}$ up through the compensation network, so even though ideally, switch 402 pulls the output voltage to ground, the voltage a node A can still cause a pop at the output, albeit a suppressed pop.

Figure 5:
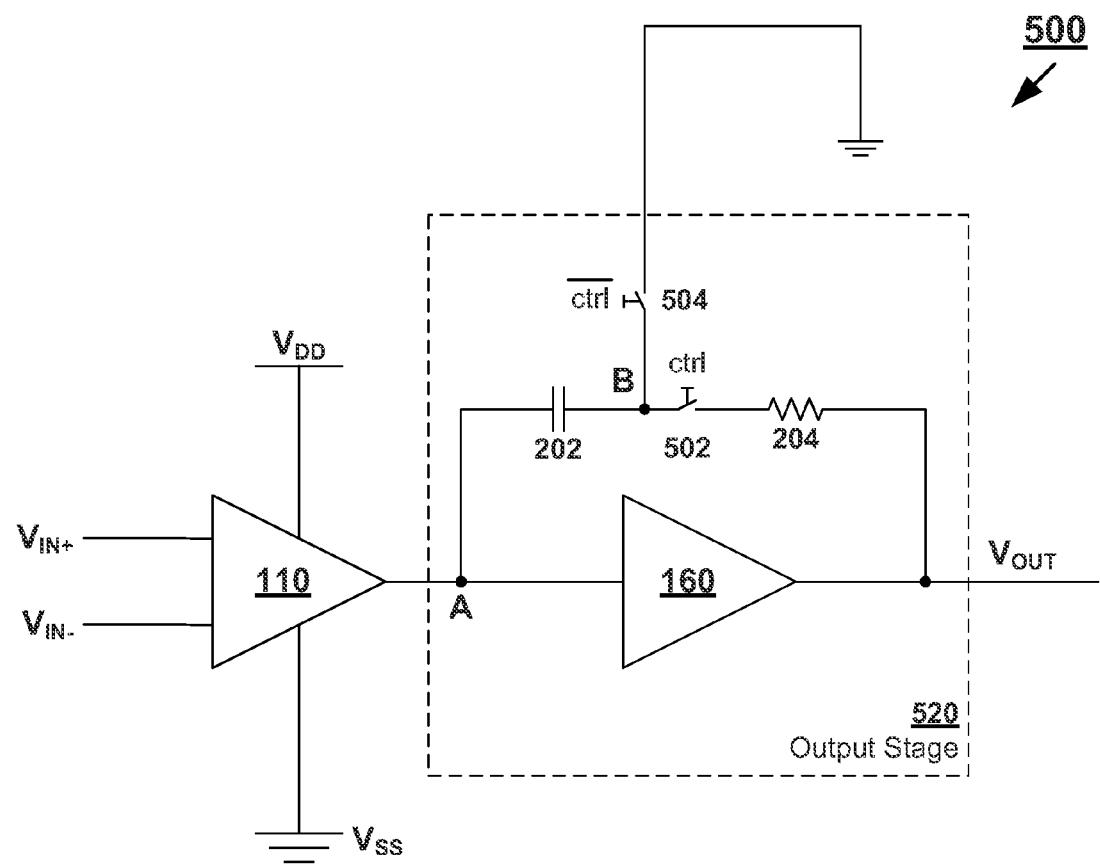
FIG. 5 illustrates an amplifier equipped with an improved anti-pop circuit.

FIG. 5 illustrates an amplifier equipped with an improved anti-pop circuit. Amplifier 500 is similar to amplifier 200. Amplifier 500 comprises amplifier stage 110 and output stage 520. Like output stage 220 of amplifier 200, output stage 520 comprises core output stage 160 and a compensation network comprising capacitor 202 and resistor 204. The described components function essentially the same as that described for amplifier 200. However, output stage 520 further comprises switch 502 and switch 504. Switch 502 is closed when the control signal is high and switch 504 is opened when the control signal is high. When the control signal is high, the circuit behaves essentially the same as amplifier 200. Compensation capacitor 202 and compensation resistor 204 feed back $V_{OUT}$ to node A to provide stability to amplifier 500. However, when the control signal is low such as prior to power up, node A is shunted through capacitor 202 to $V_{SS}$. Furthermore, with switch 502 open, the path from node A to $V_{OUT}$ through the compensation network is broken. As a result, node A does not influence $V_{OUT}$ until the circuit is powered up, thus, mitigating any pop at the output.

Ideally, the control signal is low during any power transition, i.e., power up or power down. It is also important to note that switch 504 also prevents capacitor 202 from floating. If capacitor 202 was allowed to remain floating, the absolute voltage of each electrode of the capacitor will change due to the changes in the amplifier stage, even though the charge in the capacitor and therefore the voltage across the electrodes of the capacitor will remain unchanged. At the same time, $V_{OUT}$ should stay at $V_{SS}$. Thus, when switch 502 is closed, the voltage difference between node B of and $V_{OUT}$ will cause a pop at $V_{OUT}$.

Figure 6:
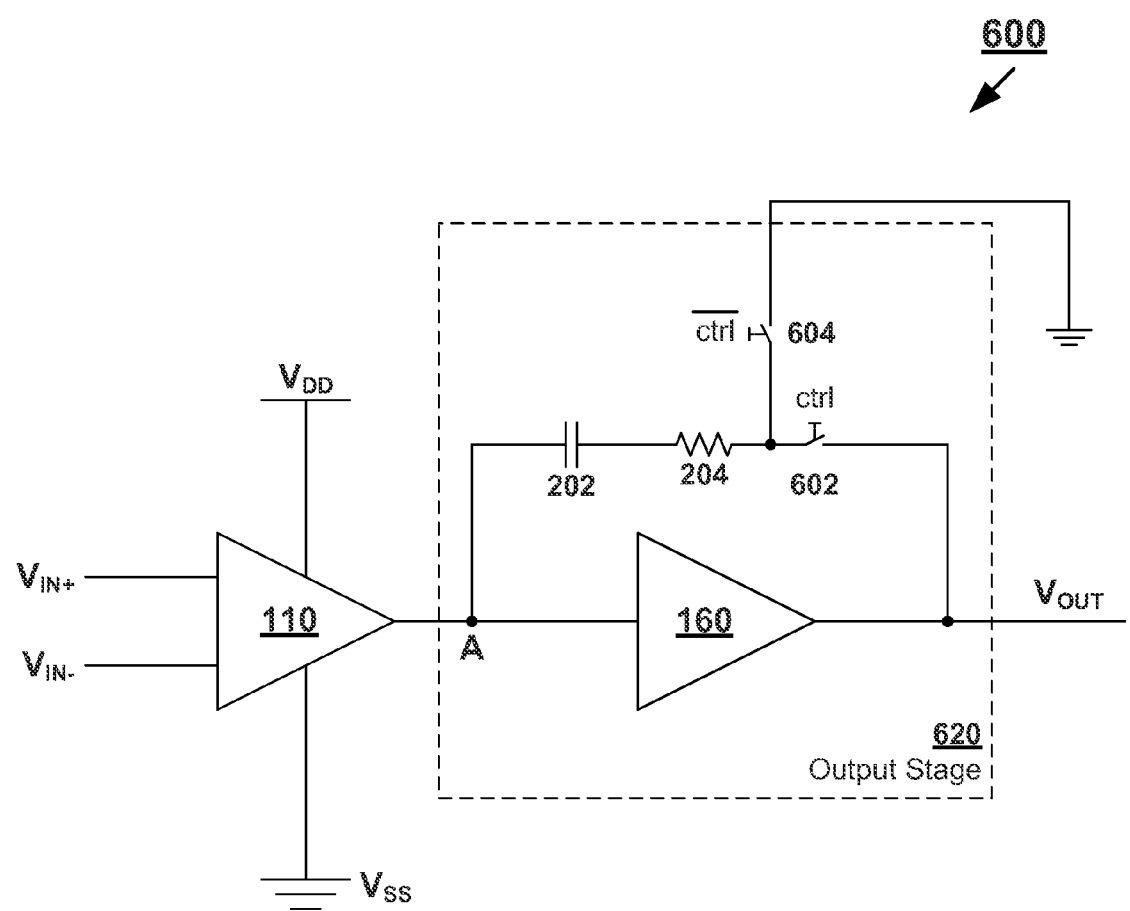
FIG. 6 illustrates an amplifier equipped with an alternative anti-pop circuit.

Alternatively, FIG. 6 illustrates an amplifier equipped with an anti-pop circuit. Instead of modifying the compensation network as in the manner shown for amplifier 500. Output stage 620 of amplifier 600 comprises switch 602 which when opened breaks the compensation network between resistor 204 and the output of the amplifier rather than between resistor 204 and capacitor 202 as in amplifier 500. When the control signal is high, amplifier 600 operates normally like that of amplifier 200. When the control signal is low, switch 604 shunts capacitor 202 to ground through resistor 204 and switch 602 disconnects node A from $V_{OUT}$.

Figure 7:
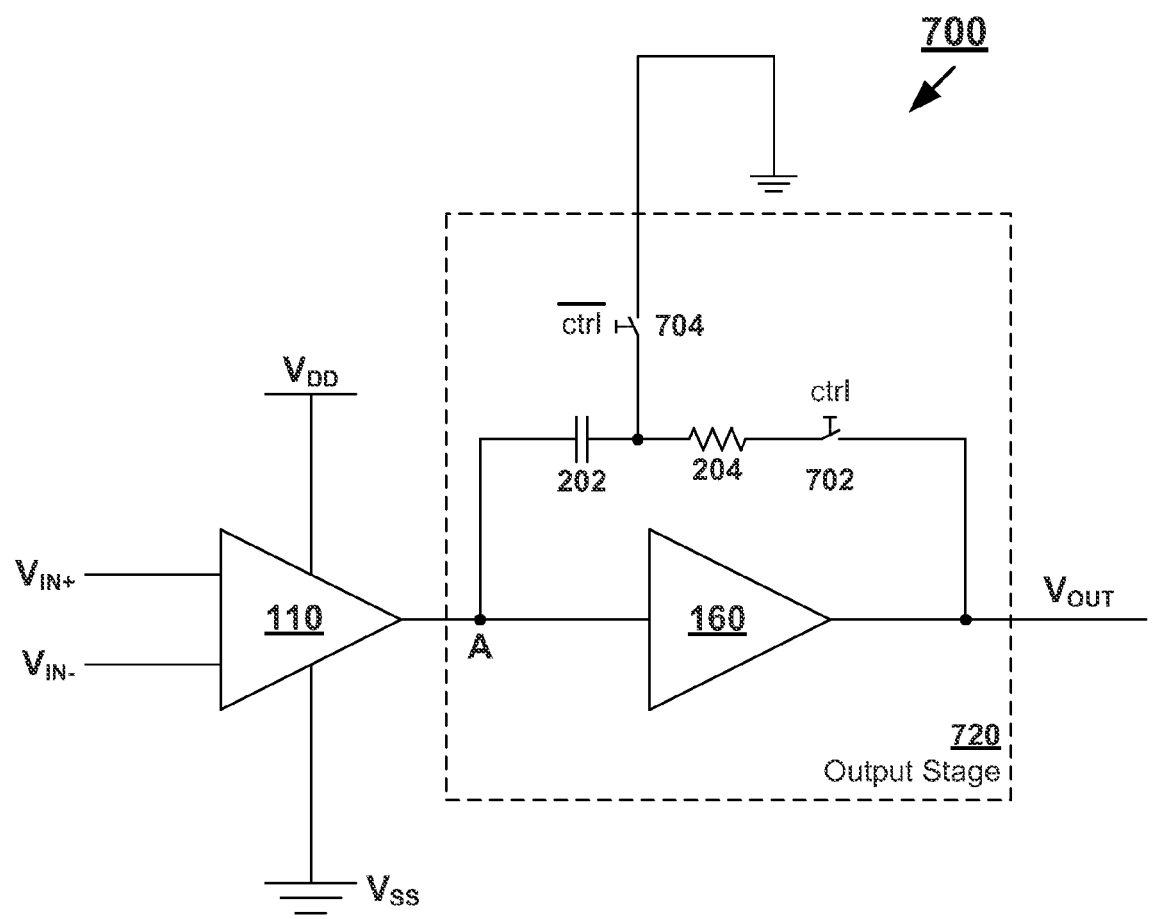
FIG. 7 illustrates an amplifier comprising an anti-pop circuit with different switch locations.

It should be noted principles of modifying a compensation network to disconnect node A from $V_{OUT}$, while simultaneously draining any residual charges in the compensation network can be applied to other compensation networks. Furthermore, the placement of the various switches can be varied with the same result. For example, FIG. 7 shows an amplifier comprising an anti-pop circuit where the switch 702 functions similarly to switch 502 of amplifier 500, but located in a different location in the path between node A and $V_{OUT}$. A compensation network with the capacitor and resistor transposed from that shown for amplifiers 200, 400, 500, 600, and 700 introduces countless more combinations of switch positions. No doubt the various combinations of switch locations and compensation network elements would be apparent to one of ordinary skill in the art.

Figure 8:
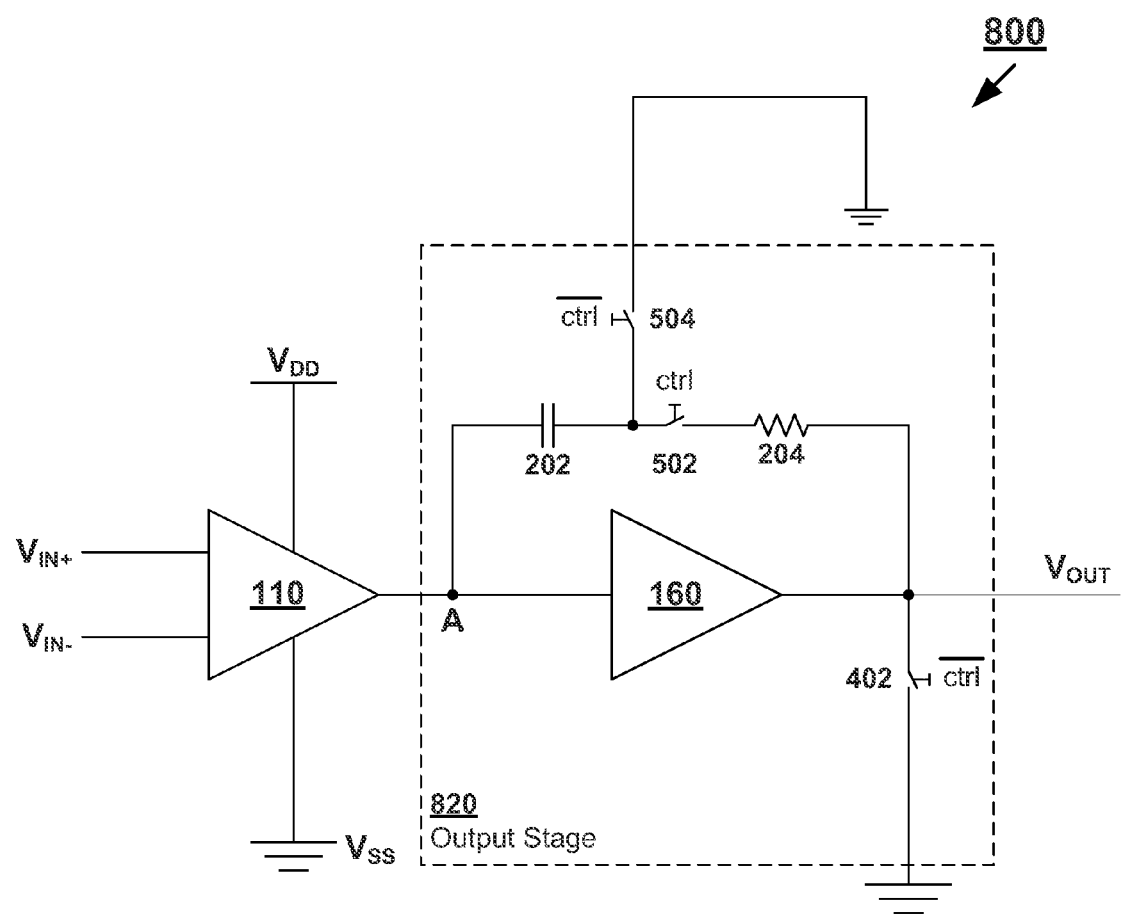
FIG. 8 illustrates an amplifier with an anti-pop circuit using the principles illustrated in the anti-pop circuits described for amplifiers 400 and 500

FIG. 8 illustrates an amplifier with an anti-pop circuit using the principles illustrated in the anti-pop circuits described for amplifiers 400 and 500. Again, amplifier 800 is similar to that described in the previous figures. Similar to output stages of previously described amplifiers, output stage 820 incorporates switch 402 to drag down $V_{OUT}$ as well as switch 502 to break the path between node A and $V_{OUT}$. In Addition, switch 504 shunts node A to $V_{SS}$ through capacitor 202. Similar to that described for amplifier 400, switch 402 drags down $V_{OUT}$ to $V_{SS}$ when the control signal is low. Therefore, prior to power up, switch 402 is closed. Switch 502 and 504 behave in essentially the same manner as described for amplifier 500. Therefore, when the control signal is high, the amplifier behaves essentially like amplifier 400. However, when the control signal is low, such as prior to power up or just after power down, $V_{OUT}$ is dragged to ground, Node A is shunted to $V_{SS}$ and the connection between capacitor 202 and resistor 204 is broken.

Figure 9A:
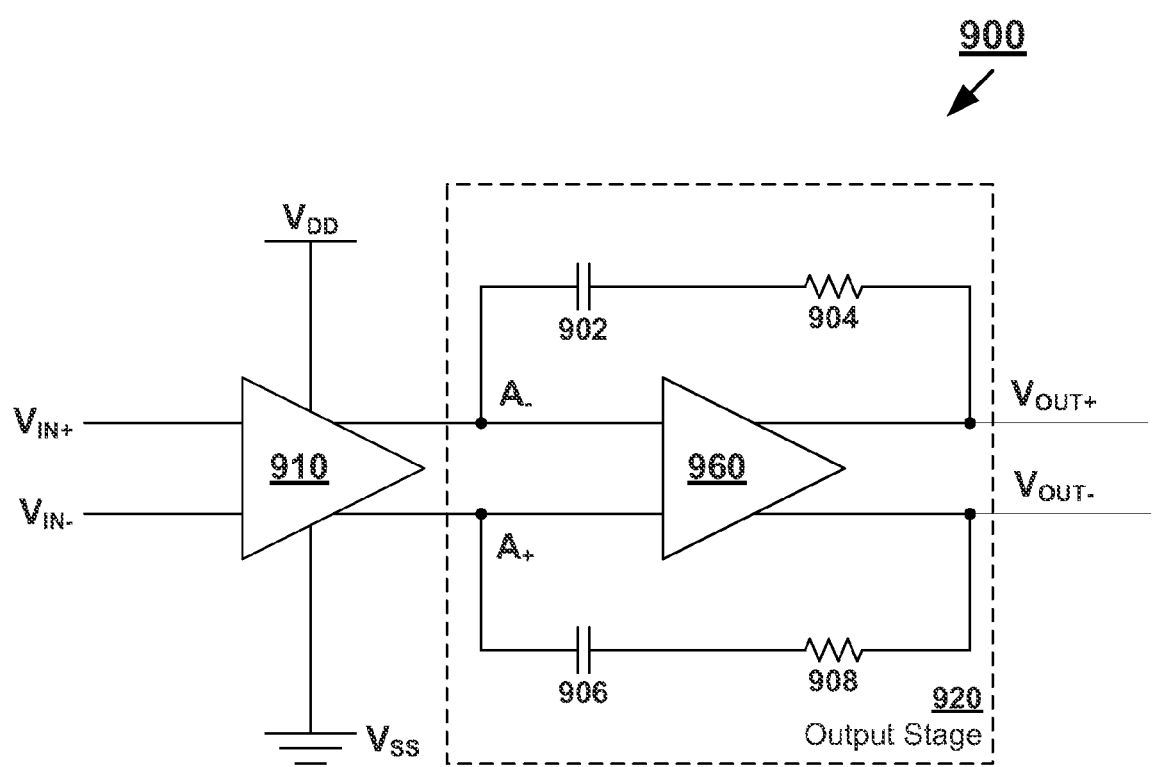
FIG. 9A illustrates a two-stage differential amplifier comprising a differential amplifier stage and differential output stage.

For simplicity, the earlier examples have used a single ended amplifier stage in a single ended amplifier. FIG. 9A illustrates a two-stage differential amplifier comprising differential amplifier stage 910 and differential output stage 920 having core output stage 960. Differential amplifier stage 910 takes differential inputs $V_{IN+}$ and $V_{IN-}$ and provides outputs to differential output stage 920 at nodes $A_+$ and $A_-$. Differential output stage 920 has two output $V_{OUT-}$ and $V_{OUT}$. To supply stability to a compensation network with a feedback path from $V_{OUT+}$ to node $A_-$ and a compensation network with a feedback path from $V_{OUT-}$ to node $A_+$ are added to differential output stage 920. In a typical implementation, the differential stage is inverting hence, the voltage $V_{OUT+}$ is fed back in a compensation network to node $A_-$ and not $A_+$. In the example of FIG. 9A, the compensation networks can be as simple as comprising a capacitor and a resistor. Output stage 920 of amplifier 910 comprises a compensation network with resistor 902 and capacitor 904 which provides a path between $V_{OUT+}$ and node $A_-$ and a compensation network with resistor 906 and capacitor 908 which provides a path between $V_{OUT-}$ and node $A_+$. The paths during power up and power down unfortunately provide a path for a spike to traverse from differential amplifier stage 910 to output $V_{OUT+}$ and/or output $V_{OUT-}$.

Figure 9B:
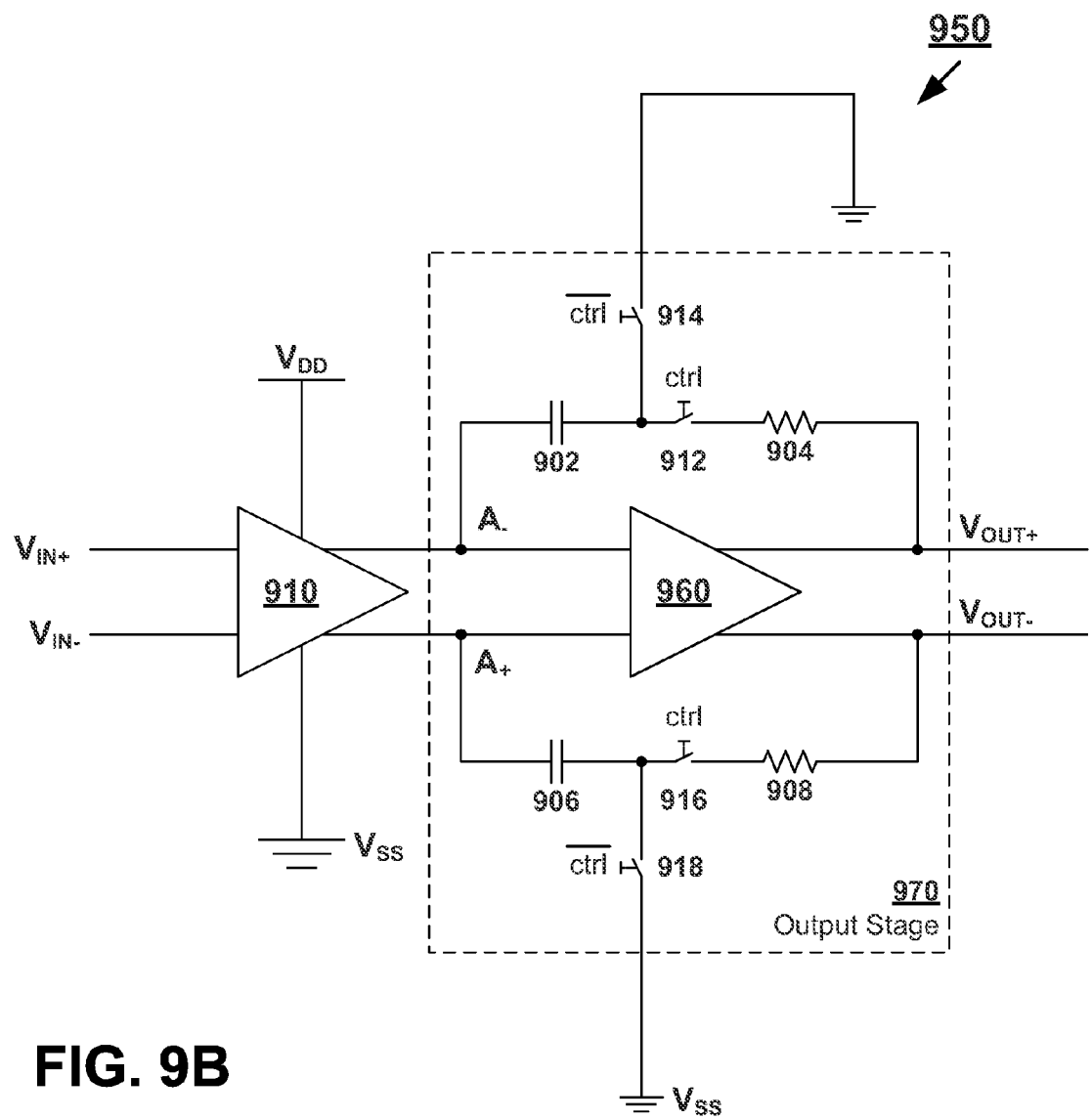
FIG. 9B shows a differential amplifier with analogous anti-pop circuitry to the single ended amplifiers described above.

FIG. 9B shows a differential amplifier with analogous anti-pop circuitry to the single ended amplifiers described above. Amplifier 950 comprises output stage 970 which is similar to output stage 920, but includes switches for breaking the path from output to the input node via the compensation network. Furthermore, it comprises a switch for shunting the capacitor in the compensation network to $V_{SS}$. More specifically switch 912 is open during power up or power down and breaks the path between $V_{OUT+}$ and node $A_-$ and switch 914 is closed during power up or power down and shunts capacitor 902 to $V_{SS}$. Similarly, switch 916 is opened during power up or power down and breaks the path $V_{OUT-}$ and node $A_+$ and switch 918 is closed during power up or power down and shunts capacitor 906. During power up or power down the control signal supplied to the switches is low, otherwise it is high. When the control signal is high amplifier 950 behaves like amplifier 900.

While not shown, one of ordinary skill in the art could vary the switch placement and the type of compensation network. Furthermore, switches can be placed at each of the differential outputs to pull down $V_{OUT+}$ and $V_{OUT-}$ to $V_{SS}$.

Another common amplifier implementation is a push-pull output stage. In a typical push-pull output stage, two complementary transistors are placed in series such as shown in FIG. 11 with FET 1102 and FET 1104. The output is tapped between the two transistors. Often, the complementary transistors are an n-channel FET (NFET) and a p-channel FET (PFET), other configurations include a npn bipolar transistor and a pnp bipolar transistor. Quite often the inputs to the transistors (such as the gate on FET) require different biasing. Because the inputs to the transistors often require different bias voltages. A bias circuit is often used between the amplifier stage and the output stage. The output of the bias circuit generates two voltages one for each transistor in a push-pull output stage.

Figure 10A:
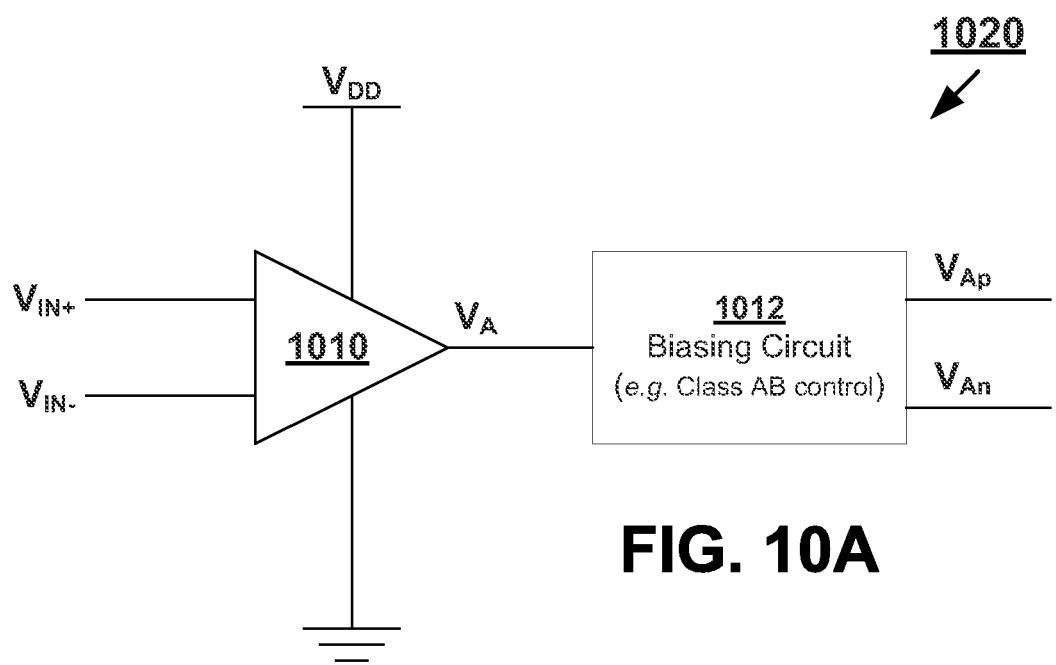
FIG. 10A illustrates the preliminary stages of an amplifier using a push-pull output stage.

FIG. 10A illustrates the preliminary stages of an amplifier. Preliminary stages 1020 comprises amplifier stage 1010 which behaves similarly to the amplifier stage 110 described above. Amplifier stage 1010 receives differential inputs with voltages $V_{IN+}$ and $V_{IN-}$ and produces an output which is the amplified difference between $V_{IN+}$ and $V_{IN-}$. The output having a voltage of $V_A$ is separately biased for use by a push-pull output stage, by bias circuit 1012 such as class AB bias control. The outputs of bias circuit 1012 have voltages equal to the input of $V_A$ with a fixed bias. Specifically, $V_{Ap}=V_A+V_{bias1}$ and $V_{An}=V_A-V_{bias2}$.

Figure 10B:
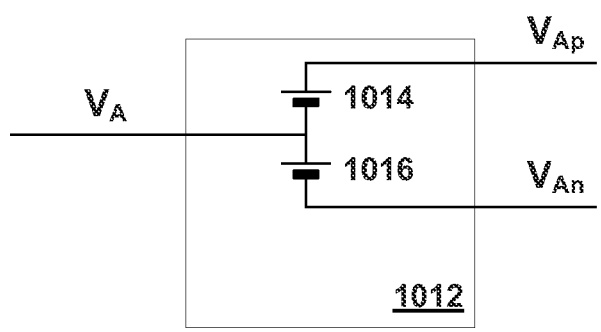
FIG. 10B illustrates a circuit diagram for an exemplary bias circuit.

FIG. 10B illustrates a circuit diagram for an exemplary bias circuit. The input voltage has a fixed bias added and subtracted with voltage source 1014 and 1016. The voltage sources maintain a fixed voltage between its two terminals. Thus if the potential across voltage source 1014 is $V_{bias1}$ then $V_{Ap}=V_A+V_{bias1}$ and if the potential across voltage source 1016 is $V_{bias2}$ then $V_{An}=V_A-V_{bias2}$. One of ordinary skill in the art should recognize that even though voltage sources 1014 and 1016 are symbolically represented by a battery any voltage source circuit can be used.

Figure 10C:
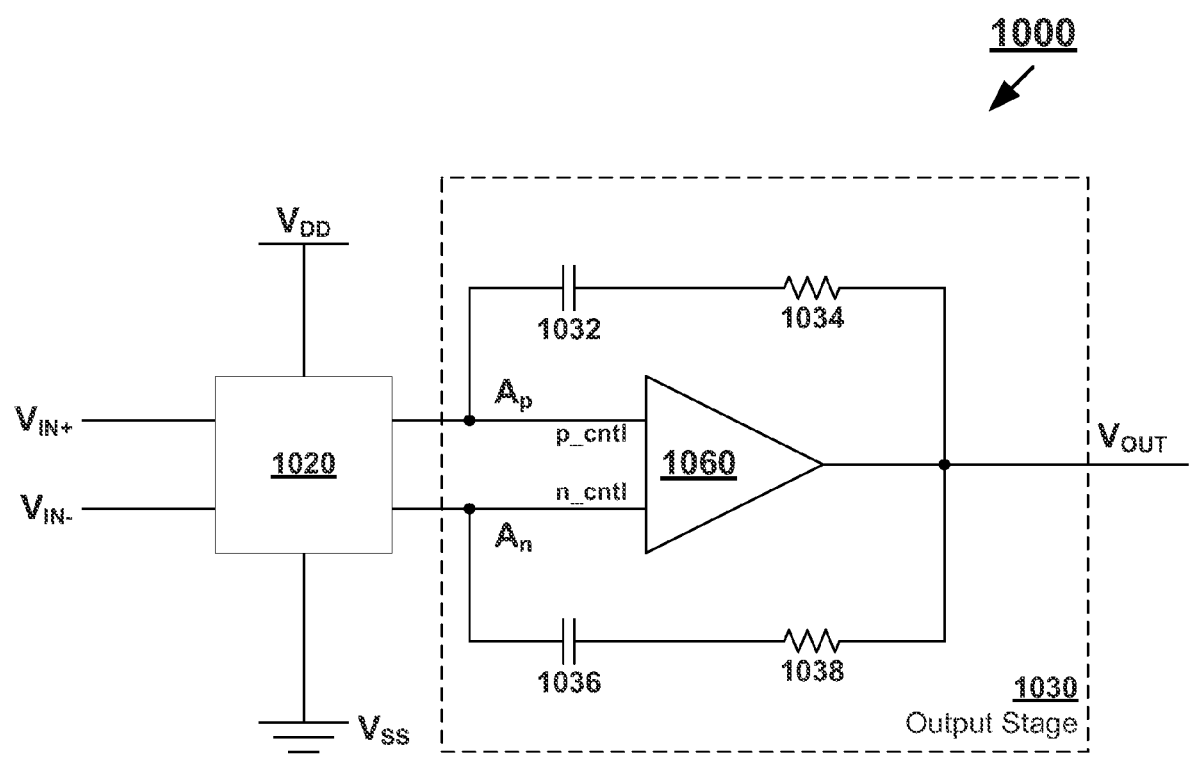
FIG. 10C illustrates an amplifier with a push-pull output stage.

FIG. 10C illustrates an amplifier with a push-pull output stage. Amplifier 1000 comprises preliminary stages 1020. Preliminary stages 1020 receives differential input $V_{IN+}$ and $V_{IN-}$ and produces an output which is the amplified difference between $V_{IN+}$ and $V_{IN-}$, but the output is presented with a bias. At node $A_p$, the output is appropriately biased to control a PFET in push-pull output stage 1060 and at node $A_n$, the output is appropriately biased to control a NFET in push-pull output stage 1060. The signals at nodes $A_p$ and $A_n$ are referred to as p_cntl and n_cntl, respectively. In order to stabilize amplifier 1000, output stage 1030 further comprises compensation network comprising capacitor 1032 and 1034 which provides a feedback path from $V_{OUT}$ to node $A_p$ and a compensation network comprising capacitor 1036 and resistor 1038 which provide a feedback path from $V_{OUT}$ to node $A_n$. Once again, the feedback paths introduced by the compensation networks provide paths for a pop to travel from preliminary stages 1020 to the output $V_{OUT}$.

Figure 10D:
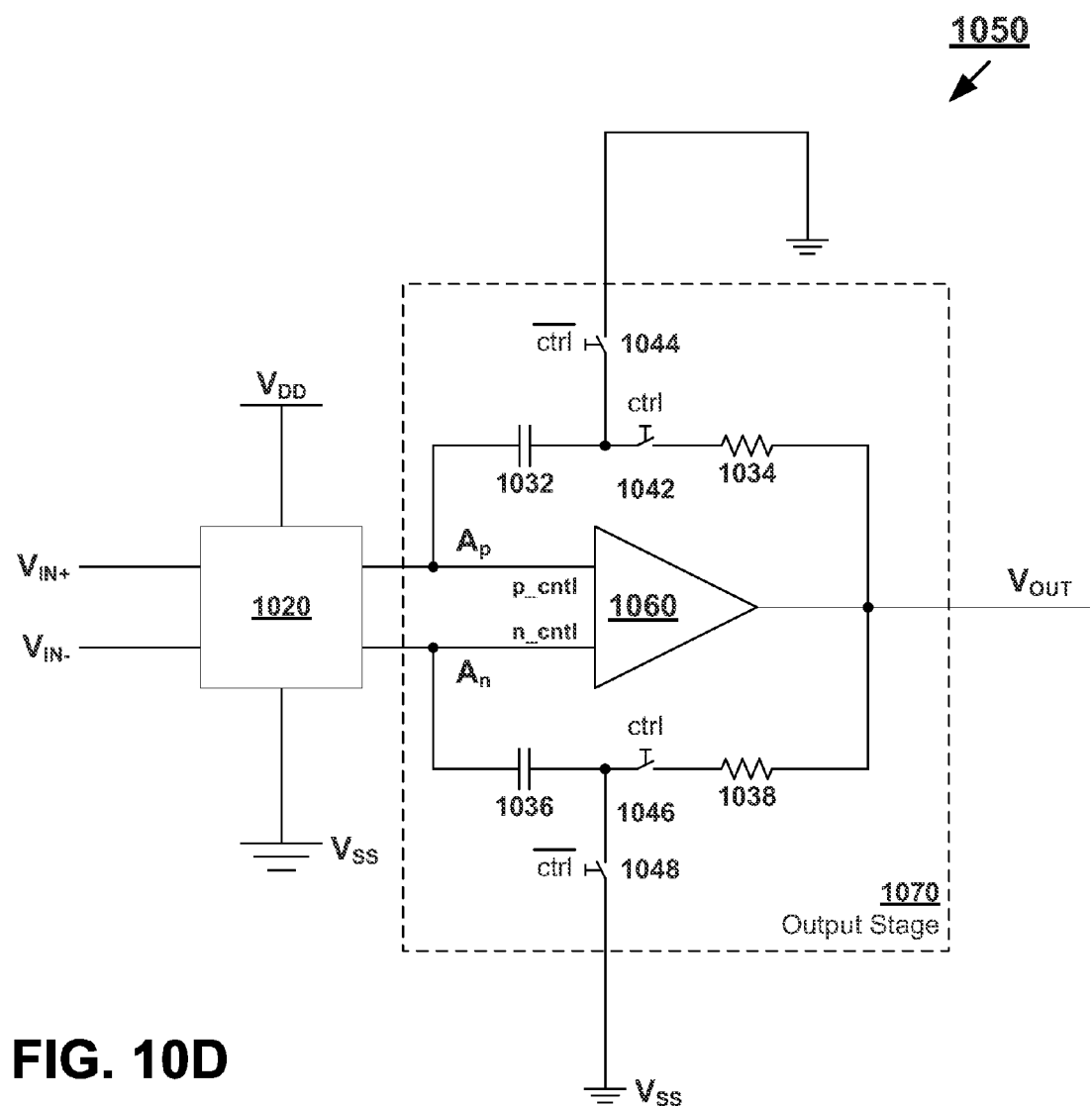
FIG. 10D illustrates an amplifier with a push-pull output stage and analogous anti-pop circuitry to the amplifiers described above.

FIG. 10D shows an amplifier with a push-pull output stage and analogous anti-pop circuitry to the amplifiers described above. Amplifier 1050 comprises output stage 1070 which is similar to output stage 1030, but includes switches for breaking the path from the output to each input node via the compensation network. Furthermore, it comprises a switch for shunting the capacitor in the compensation network to $V_{SS}$. More specifically switch 1042 is open during power up or power down and breaks the path between $V_{OUT}$ and node $A_p$ and switch 1044 is closed during power up or power down and shunts capacitor 1032 to $V_{SS}$. Similarly, switch 1046 is open during power up or power down and breaks the path $V_{OUT}$ and node $A_n$ and switch 1048 is closed during power up or power down and shunts capacitor 1036. During power up or power down the control signal supplied to the switches is low, otherwise it is high. When the control signal is high amplifier 1050 behaves like amplifier 1000.

Additional switches can be added to push-pull output stage 1060. FIG. 11 illustrates in greater detail an example of an amplifier with push-pull output stage. Amplifier 1100 comprises amplifier stage 1020 which is similar to that described for amplifiers 1000 and 1050. Furthermore, amplifier 1100 comprises output stage 1120 which comprises a push-pull output stage comprising PFET 1102 and NFET 1104. As can be seen, node $A_p$ is the input that provides PFET 1102 with the p_cntl signal and node $A_n$ is the input that provides NFET 1104 with the n_cntl signal. In principle, the p_cntl signal and n_cntl signal represent the same input but are biased differently. Though shown specifically as a generic FET, PFET 1102 is often a p-channel metal-oxide-semiconductor FET (MOSFET) in enhancement mode. Likewise, NFET 1104 is often an n-channel MOSFET in enhancement mode. In addition to switches 1042 and 1046 breaking the path provided by compensation networks from $V_{OUT}$ to the respective nodes $A_p$ and $A_n$ and in addition to switches 1044 and 1046 which shunt capacitors 1032 and 1036 to $V_{SS}$ as described for amplifier 1050. Switch 1106 which is closed during power up and power down pulls $V_{OUT}$ to $V_{SS}$ output stage having anti-pop circuitry added. Switch 1106 operates similarly to switch 402 described for amplifier 800.

In addition, output stage 1120 further comprises switch 1108 which drags the voltage at node $A_p$ to $V_{DD}$, that is p_cntl is $V_{DD}$ when switch 1108 is closed. During power up and power down, switch 1108 is closed, by forcing p_cntl to be $V_{DD}$, PFET 1102 as a gate-to-drain voltage of zero effectively shutting PFET 1102. Essentially, this insures that no current is flowing through PFET 1102. This also has the effect of charging capacitor 1042 so that even after the control signal goes high and switches 1108 and 1044 open, p_cntl begins initially at $V_{DD}$ therefore PFET 1102 begins with no current flowing through it, thus preventing a pop from manifesting after the control signal causes switch 1108 and 1044 to open and switch 1042 to close.

When the control signal is high, switches 1044, 1048, 1106 and 1108 are open and switches 1042 and 1046 are close. Hence output stage 1120, functions as a compensated push-pull output stage.

There are several methods to implement a control signal. As mentioned before, the ideal control signal should be low during power up and power down. For example, the control signal could be latched to $V_{DD}$ as soon as $V_{DD}$ reaches a predetermined level, the control signal goes high and as soon as $V_{DD}$ drops below a predetermined level the control signal goes low. However, this simple approach leaves the possibility of an audio pop.

Figure 12:
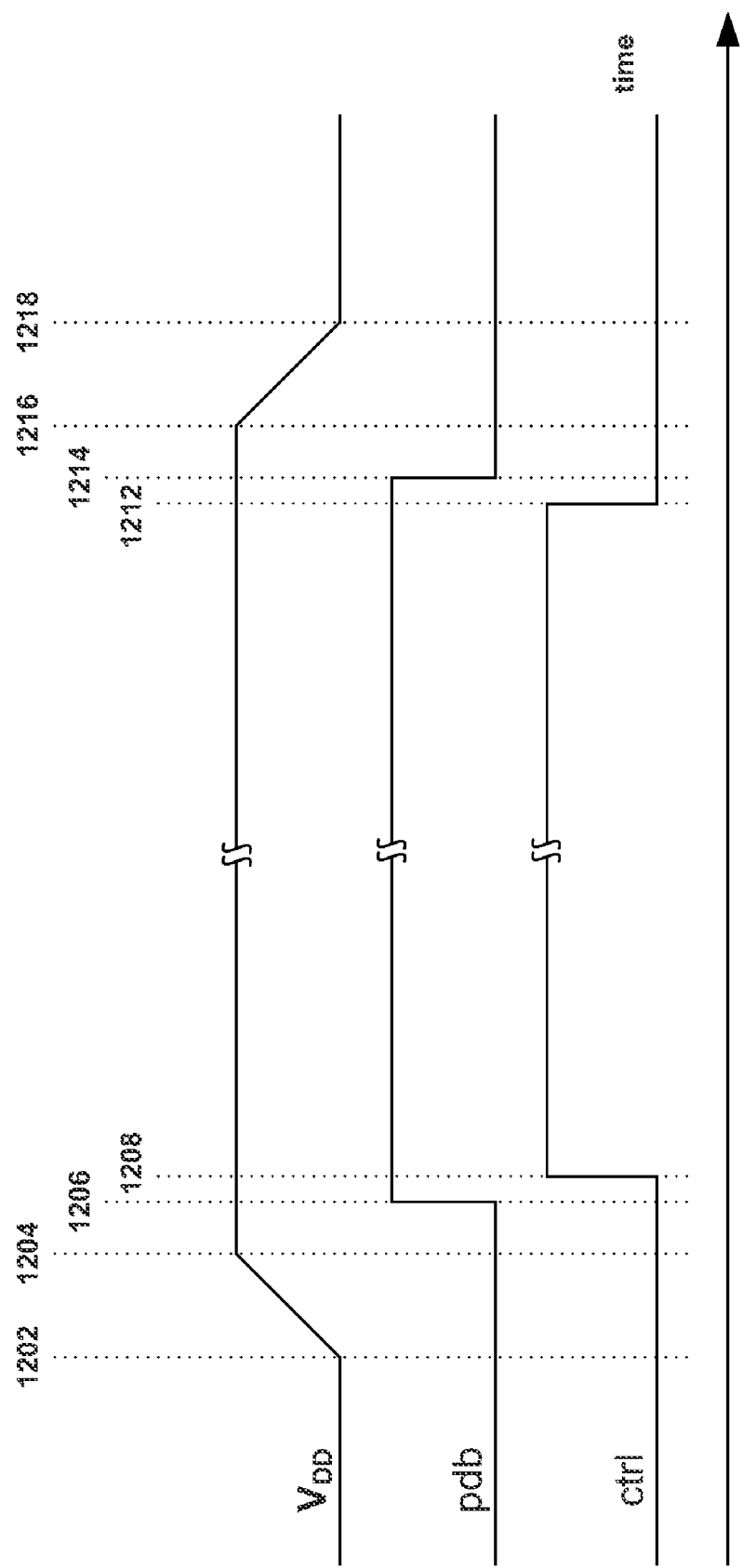
FIG. 12 shows the timing of the control signal.

FIG. 12 shows the timing of an alternative control signal. At time 1202, the power supply voltage $V_{DD}$ begins to ramp up. Prior to this time the control signal is low and remains low. At time 1204, $V_{DD}$ reaches normal operating level, but the control signal still remains low. Up to this time, $V_{OUT}$ is forced to $V_{SS}$. A short time later at time 1208, control signal goes high and the amplifier begins to operate normally. Because the amplifier is allowed to completely powered up before activating the control signal any audio pop is completely suppressed. In the power down sequence, at time 1212, the control signal goes low, however, the power supply voltage $V_{DD}$ remains at normal operating levels. At this point, the amplifier is essentially deactivated and is forced $V_{OUT}$ is forced to $V_{SS}$. A short time later at time 1216, $V_{DD}$ begins to ramp down. At time 1218, $V_{DD}$ has completely powered down.

Such timing can be implemented without the need of a second voltage supply. This control signal is a non-overlapping version of power supply signal, $V_{DD}$. For example, a control signal latched to $V_{DD}$ by way of a delay circuit can delay the control signal going high until a small time interval after $V_{DD}$ has reached normal operating voltage. In many applications, such as this example, the circuitry is controlled by a digital control. As an example a power down bar (pdb) signal used to indicate whether the amplifier block is powered up or down. For the power up sequence, the pdb signal goes high at time 1206 shortly there after the control signal goes high. During power down the digital circuitry begins to power down the block. First the control signal goes down at 1212, then the pdb signal goes down at 1214 and finally the power signal begins to ramp down at 1216.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

We claim:

1. A reduced pop amplifier comprising:
   an amplifier stage;
   an output stage comprising:
      a core output stage;
      an input to the core output stage coupled to the amplifier stage;
      an output of the core output stage and;
      a compensation network coupled between the output and the input;
   said compensation network comprising a capacitor, a first switch and a second switch;
   wherein the first switch breaks the connectivity between the output and the input when a control signal is low but maintains the connectivity between the input and the output when the control signal is high and the second switch shunts the capacitor to a low power voltage when the control signal is low, and wherein the control signal is low when the amplifier stage is powered down and remains low until after the amplifier stage is powered up and remains high until before the amplifier stage is powered down.

2. The reduced pop amplifier of claim 1, wherein the low power voltage is ground.

3. The reduced pop amplifier of claim 1, wherein the compensation network further comprises a resistor.

4. The reduced pop amplifier of claim 1, further comprising a third switch, wherein the third switch pulls the output to the low power voltage when the control signal is low.

5. The reduced pop amplifier of claim 1, wherein the core output stage is a differential output stage having a second input and a second output, and wherein the output stage further comprises a second compensation network coupled between the second output and the second input;
said second compensation network having a second capacitor, a third switch and a fourth switch, wherein the third switch breaks the connectivity between the second output and the second input when a control signal is low but maintains the connectivity between the second input and the second output when the control signal is high and the fourth switch shunts the second capacitor to a low power voltage when the control signal is low.

6. The reduced pop amplifier of claim 1 further comprising:
a bias circuit between the amplifier stage and the output stage;
wherein the core output stage is a push-pull output stage having a second input and wherein the output stage further comprises a second compensation network coupled between the output and the second input;
said second compensation network having a second capacitor, a third switch and a fourth switch, wherein the third switch breaks the connectivity between the output and the second input when a control signal is low but maintains the connectivity between the second input and the output when the control signal is high and the fourth switch shunts the second capacitor to a low power voltage when the control signal is low.

7. The reduced pop amplifier of claim 6 further comprising a fifth switch, wherein the fifth switch pulls the output to the low power voltage when the control signal is low.

8. The reduced pop amplifier of claim 6, further comprising a fifth switch, wherein the fifth switch pulls the input to the high power voltage when the control signal is low.

9. The reduced pop amplifier of claim 6, wherein the core output stage further comprises a p-type field effect transistor (FET) and an n-type FET.

10. A method for reducing pop in an amplifier comprising:
breaking a connection in a compensation network coupled to an input and an output of an output stage in an amplifier circuit to prevent current from flowing between the output and the input;
shunting a capacitor in the compensation network to a low power voltage; and
pulling the output to the low power voltage.

11. A method for reducing pop in an amplifier circuit comprising:
receiving a control signal; and
performing the method of claim 10, whenever the control signal is low.

12. The method of claim 10 wherein the output stage further comprises:
a second compensation network coupled to a second input and a second output and said method further comprising:
breaking a connection in the second compensation network to prevent current from flowing between the second output and the second input; and
shunting a second capacitor in the second compensation network to a low power voltage.

13. The method of claim 12 further comprising pulling the second input to the high power voltage.

14. The method of claim 12 wherein the output and the second output are combined.

15. The method of claim 10 wherein the control signal is low when the amplifier circuit is powered down and remains low until after the amplifier circuit is powered up and remains high until before the amplifier circuit is powered down.

16. A reduced pop amplifier comprising:
an amplifier stage;
an output stage comprising:
a core output stage;
an input to the core output stage coupled to the amplifier stage;
an output of the core output stage;
a compensation network comprising a capacitor coupled to the input and the output;
means for breaking a connection in the compensation network to prevent current from flowing between the output and the input;
means for shunting a capacitor in the compensation network to a low power voltage; and
means for pulling the output to the low power voltage.

17. The reduced pop amplifier of claim 16 wherein the means for breaking is a first switch controlled by a control signal and the means for shunting is a second switch controlled by the control signal.

18. The reduced pop amplifier of claim 16 further wherein the output stage further comprises:
a second input to the core output stage and a second output to the core output stage;
a second compensation network having a capacitor coupled to the second input and the second output;
means for breaking a connection in the second compensation network to prevent current from flowing between the second output and the second input; and
mean for shunting the second capacitor in the second compensation network to a low power voltage.

19. The reduced pop amplifier of claim 18 wherein the output and the second output are combined.

20. A system for reducing pop in an amplifier comprising:
a compensation network coupled to an input and an output of an output stage in an amplifier circuit, wherein the compensation network is configured to prevent current from flowing between the output and the input;
a capacitor in the compensation network configured to be shunted to a low power voltage; and
a switch configured to pull the output to the low power voltage when the amplifier circuit is powered down.

21. The system of claim 20 further comprising a controller for generating a control signal to control the switch.

22. The system of claim 20 wherein the switch is configured to pull the output to the low power voltage when the capacitor in the compensation network is shunted to the low power voltage.

* * * * *

UNITED STATES PATENT AND TRADEMARK OFFICE
CERTIFICATE OF CORRECTION

PATENT NO. : 8,063,699 B2
APPLICATION NO. : 12/488438
DATED : November 22, 2011
INVENTOR(S) : Xin Fan, Christian Larsen and Lorenzo Crespi Page 1 of 1

It is certified that error appears in the above-identified patent and that said Letters Patent is hereby corrected as shown below:

Column 10, line 40, replace "mean" with "means"

Signed and Sealed this
Tenth Day of January, 2012

David J. Kappos
*Director of the United States Patent and Trademark Office*